United States Patent
Terry

(10) Patent No.: US 7,876,151 B1
(45) Date of Patent: *Jan. 25, 2011

(54) R/2R PROGRAMMABLE GATE ARRAY

(75) Inventor: Andrew Terry, Carlingford (AU)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/592,622

(22) Filed: Nov. 30, 2009

Related U.S. Application Data

(60) Provisional application No. 61/278,700, filed on Oct. 8, 2009.

(51) Int. Cl.
*H03G 3/00* (2006.01)

(52) U.S. Cl. .......................... 330/86; 330/278; 330/260

(58) Field of Classification Search .................. 330/86, 330/278, 260
See application file for complete search history.

(56) References Cited

U.S. PATENT DOCUMENTS

| | | | |
|---|---|---|---|
| 6,032,109 A * | 2/2000 | Ritmiller, III ................ 702/104 |
| 6,127,893 A | 10/2000 | Llewellyn et al. |
| 6,147,558 A | 11/2000 | Sculley |
| 6,239,655 B1 * | 5/2001 | Orozov et al. .................. 330/86 |
| 6,405,164 B1 * | 6/2002 | Pinai ........................... 704/225 |
| 6,448,856 B2 | 9/2002 | Noro et al. |
| 6,518,910 B2 * | 2/2003 | Sakuragi et al. ............. 341/162 |
| 6,545,620 B2 * | 4/2003 | Groeneweg ................. 341/139 |
| 6,693,491 B1 | 2/2004 | Delano |
| 6,807,406 B1 | 10/2004 | Razavi et al. |
| 6,885,236 B2 * | 4/2005 | Vorenkamp ................. 327/540 |
| 7,162,029 B2 | 1/2007 | Soman et al. |
| 7,298,855 B2 | 11/2007 | Tsuji et al. |
| 7,339,434 B1 * | 3/2008 | Shirvani-Mahdavi et al. ........................... 330/282 |
| 7,466,746 B2 * | 12/2008 | Gupta ........................ 375/219 |
| 2008/0212802 A1 | 9/2008 | Shih et al. |

* cited by examiner

*Primary Examiner*—Patricia Nguyen
(74) *Attorney, Agent, or Firm*—Saile Ackerman LLC; Stephen B. Ackerman

(57) ABSTRACT

Systems and methods to achieve an IC audio volume control requiring minimum silicon area and having an accurate volume control gain setting are disclosed. A resistive element in form of a R/2R ladder is deployed between an output node of an operational amplifier and an input node of the circuit. All resistors of said resistive element are unit resistors having a same resistance, wherein said unit resistors are arranged in parallel or series combinations to achieve a resistance desired. A first number of switches are deployed between nodes of the R/2R ladder and an inverting input of the operational amplifier. Furthermore a second number of switches are deployed between nodes within resistor units of the R/2R ladder and the inverting input. The circuit invented could have a single input or a differential input, or a single ended output or a differential output.

17 Claims, 3 Drawing Sheets

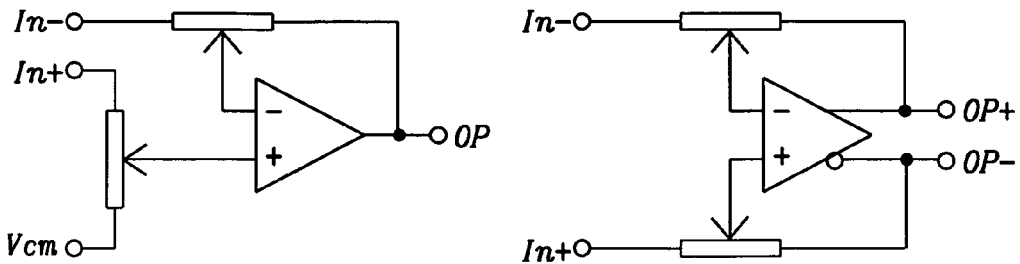
FIG. 1
Prior Art
FIG. 2
Prior Art
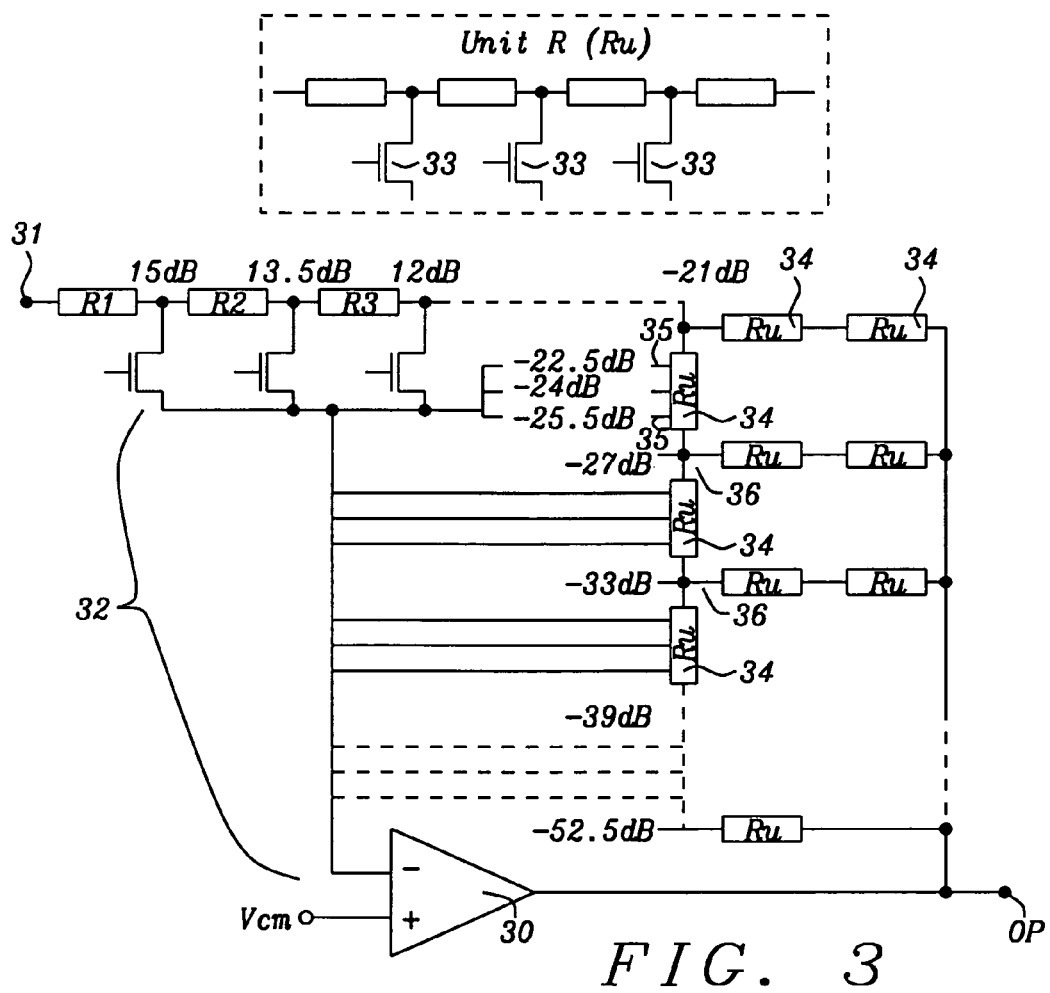
FIG. 3

R/2R PROGRAMMABLE GATE ARRAY

This application claims benefit to U.S. Provisional Application Ser. No. 61/278,700, filed on Oct. 8, 2009, which is commonly owned, and is incorporated by reference in its entirety.

BACKGROUND OF THE INVENTION (1) Field of the Invention

This invention relates generally to audio volume controls and relates more specifically to an IC audio volume control comprising an operational amplifier and one or more R/2R ladder networks.

(2) Description of the Prior Art

IC audio volume controls are typically implemented by creating a potentiometer, which is used for the input and feedback resistors round an operational amplifier as shown in FIG. 2 prior art. The arrangement is favored over those which attenuate the input signal by means of a potentiometer to $V_{CM}$, as shown in FIG. 1 prior art, as this results in the volume section switches having to carry current, so they have to be large in order to achieve audio linearity requirements. This arrangement also guarantees monatomic gain steps, an important consideration in an audio volume control.

For noise performance in the −100 dBV region resistances of 40 kΩ are required. To achieve an attenuation of 60 dB, resistor ratios of 1000 to 1 are required; this results in a requirement for low value resistances with accurate matching to high value resistances. To achieve this, a large number of unit resistors are typically used in various series and parallel combinations.

It is a challenge for the designers of audio systems to achieve circuits for audio volume controls requiring minimum silicon area, accurate volume gain settings, and a gain range that can be extended to very high levels of attenuation with very little area overhead.

There are known patents or patent publications dealing with circuits for audio volume controls:

U.S. Patent (U.S. Pat. No. 6,448,856 to Noro et al) proposes an electronic volume circuit, which can be driven by a single power source and can therefore be formed by an LSI that can be fabricated in a simple manner using an oxide film and a junction process for a single power source. A first amplifying circuit attenuates the amplitude of a bipolar input signal and converts the attenuated input signal to a unipolar signal, and a variable resistor device controls the degree of attenuation of the first amplifying circuit based on an externally supplied signal.

U.S. Patent (U.S. Pat. No. 6,807,406 to Razavi et al.) discloses a receiver system with a variable gain mixer circuit that is advantageous over current architectures used in wireless communication systems. The use of a variable gain mixer circuit simplifies the receiver architecture resulting in the elimination of additional circuit blocks and a reduction in complexity and cost. Moreover, one embodiment of the present invention includes a mixer circuit comprising a mixer core, a bias circuit coupled to the mixer core for providing a bias current, and a variable impedance network. The mixer core receives input signals and generates output currents that are coupled to the variable impedance network. Each of the output currents is selectively coupled to a voltage output node through variable impedance. Variable gain is established by varying the impedance between the output currents of the mixer core and the voltage output node.

U.S. Patent Publication (US 2008/0212802 to Shih et al.) describes an audio processing system comprising an audio processor and an audio amplifier. The audio processor receives a data signal to generate a processed signal, and comprises at least one gain control circuit and at least one operational amplifier. The gain control circuit generates a gain signal according to a volume control signal, a reference signal, and a feedback signal. The operational amplifier couples to the gain control circuit and amplifies the data signal by the gain signal to generate a processed signal. The audio amplifier couples to the audio processor to receive and amplify the processed signal, wherein an amplified signal is generated.

Furthermore the following patents are known:

U.S. Patent (U.S. Pat. No. 7,298,855 to Tsuji et al) proposes a volume circuit containing resistive ladder circuits, from which a desired fractional voltage output (Vs) is extracted and supplied to an amplifier to provide an output voltage (Vout). The resistive ladder circuits comprise multiple lines of series resistances, wherein each line contains a resistance portion 'nR' (where 'n' denotes a division index, and 'R' denotes an element resistance) that is connected in parallel with a next line, so that an overall resistance of following lines is (n−1)×n times larger than the element resistance.

U.S. Patent (U.S. Pat. No. 7,162,029,855 to Soman et al) discloses a gain or input volume controller and method including a modified R2R ladder network having a number of R2R branches, switches coupled respectively to the R2R branches, and a switch controller for respectively controlling the switches to control and provide an overall gain value for a signal. The switch controller further includes a mapper for mapping a gain control signal to the switches wherein the gain control signal respectively activates or deactivates the switches.

U.S. Patent (U.S. Pat. No. 6,693,491 to Delano) teaches a control circuit for controlling a level of an audio signal and transmitting the signal to an amplifier. The control circuit is based on an R-2R resistor network having a first plurality of resistor nodes and a parallel resistor network having a second plurality of resistor nodes. Each of the resistors in the parallel network has a value equal to one-half of the value of the preceding resistor.

U.S. Patent (U.S. Pat. No. 6,147,558 to Sculley) describes two banks of differently connected resistors, which are connected as an input to an op-amp feedback circuit.

U.S. Patent (U.S. Pat. No. 6,127,893 to Llewellyn et al.) discloses a control circuit for controlling a level of an audio signal and transmitting the signal to an amplifier. The control circuit is based on an R-2R resistor network having a plurality of resistor nodes. A plurality of switches alternately connects each of the plurality of resistor nodes to one of a plurality of low impedance nodes and a low impedance input node associated with the amplifier. Switch control circuitry selectively controls the plurality of switches to transmit the audio signal to the low impedance input node.

SUMMARY OF THE INVENTION

A principal object of the present invention is to achieve a circuit for IC audio volume controls requiring a reduced silicon area.

A further object of the invention is to achieve a circuit for IC audio volume controls having accurate volume control settings.

A further object of the invention is to achieve a circuit for IC audio volume controls having a gain range, which can be extended to very high levels of attenuation with very little silicon area overhead.

In accordance with the objects of this invention a method to achieve a circuit for an IC audio volume control requiring minimum silicon area and having an accurate volume control gain setting has been disclosed. The method invented comprises the steps of (1) providing an operational amplifier, a resistive element, and a number of switches, (2) arranging the resistive element as a R/2R ladder between an output node of the amplifier and an input node of the circuit, and (3) connecting a first number of said switches between nodes of said R/2R ladder and an inverting input of the operational amplifier. Furthermore the method comprises the steps (4) connecting a second number of said switches between nodes within resistor units in the resistive element and the inverting input of the amplifier, and (5) closing only one of said switches of said first and second number of switches to set a volume control gain.

In accordance with the objects of this invention a circuit for an IC audio volume control requiring minimum silicon area and having an accurate volume control gain setting has been disclosed. The circuit invented comprises: an operational amplifier having two inputs and an output, wherein a first input is connected to a reference voltage and a second inverting input is connected via one switch of a number of switches to a resistive element, and said resistive element being connected between an input node of the circuit and an output node of the circuit, wherein the resistive element comprises a number of matched resistor units connected in a R/2R ladder arrangement. Furthermore the circuit comprises said number of switches being deployed between R/2R ladder nodes and the amplifier inverting input, and a number of switches deployed between nodes within resistor units in the resistive element and the inverting input of the amplifier.

BRIEF DESCRIPTION OF THE DRAWINGS

In the accompanying drawings forming a material part of this description, there is shown:

FIG. 1 prior art illustrates a schematic of a circuit attenuating an input signal by means of a potentiometer to $V_{CM}$.

FIG. 2 prior art shows a schematic of a circuit implemented by creating a potentiometer that is used for the input and feedback resistors around an operational amplifier.

FIG. 3 illustrates a diagram of a preferred embodiment of the invention, e.g. a single ended amplifier topology.

DESCRIPTION OF THE PREFERRED EMBODIMENTS

Figure 4:
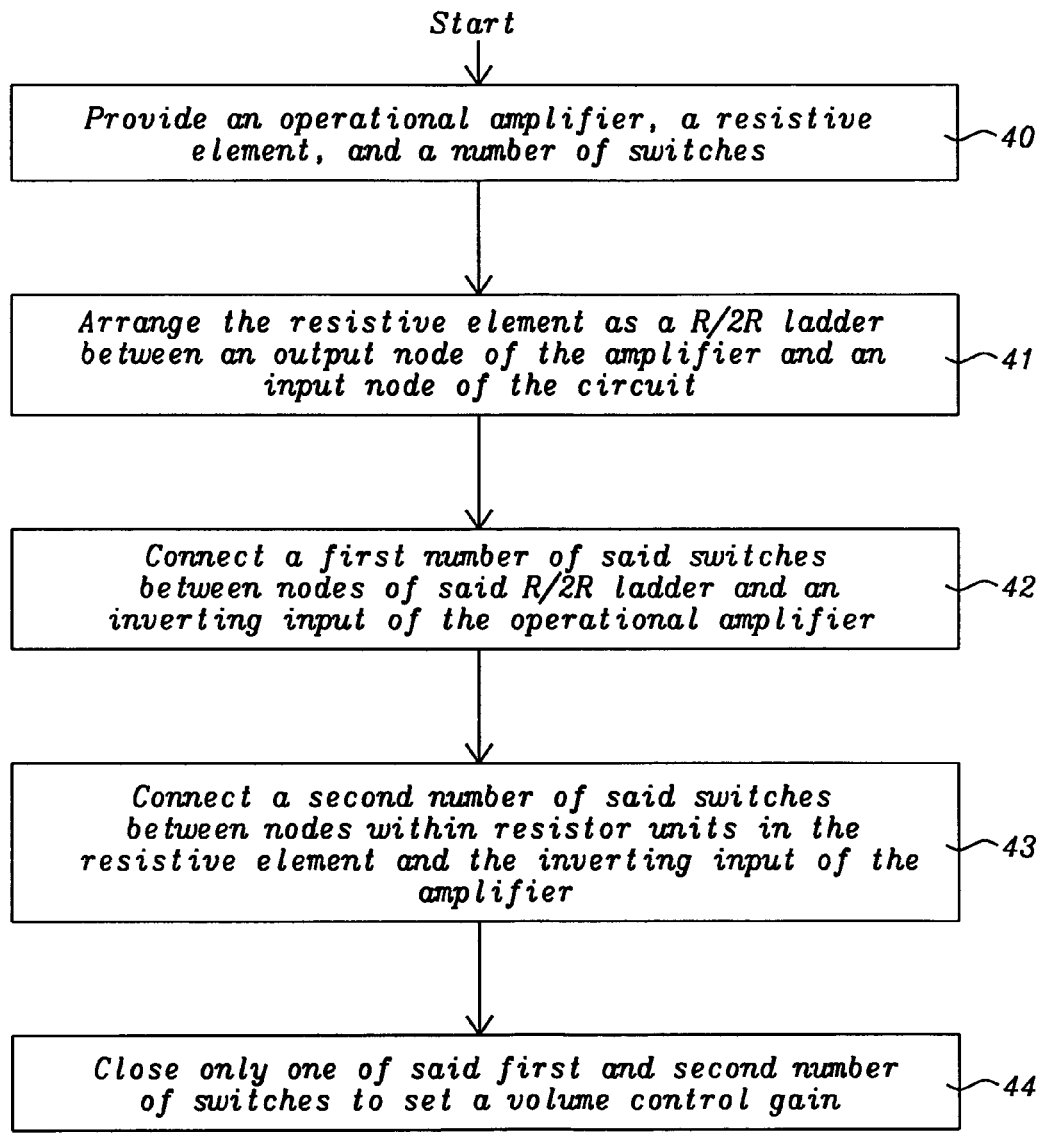
FIG. 4 illustrates a flowchart of a method to achieve a circuit for an IC audio volume control requiring minimum silicon area and having an accurate volume control gain setting.

Systems and methods for circuits for an operational amplifier volume control requiring reduced silicon area have been achieved.

FIG. 3 illustrates a diagram of a preferred embodiment of the invention, e.g. a single ended amplifier topology. The circuit invented comprises an operational amplifier 30 having two inputs and an output.node OP. In a preferred embodiment of the invention a programmable gain amplifier (PGA) is used as operational amplifier. The inputs are a circuit input 31 and a reference voltage Vcm. Furthermore the circuit comprises a resistive element 32 connected between the input node 31 and the output node. OP, wherein the resistive element 32 consists of a number of matched resistor units connected in a R/2R ladder configuration and a number of switches (not shown in FIG. 3) between the numerous R/2R ladder nodes 36 and the amplifier inverting input and a number of switches within the resistor units Ru 34 in the resistive element 32 to the inverting amplifier unit. An R/2R ladder operates as a string of current dividers whose output accuracy is solely dependent on how well each resistor is matched to the others.

The resistor units R1, R2, R3, etc. are synthesized using parallel/series combinations of the unit resistor Ru 34. In a preferred embodiment of the invention a resistor Ru 34 has a resistance around 1 kΩ to 2 kΩ. Other resistance values of resistor Ru 34 are possible as well. The resistors R1, R2, R3, Rx have a resistance in the range of 200Ω to 10 kΩ.

The standard element Ru creates a −6 dB volume control element (−6 dB is same as divide by two). The taps are positioned to create −1.5 dB, −3 dB, and −4.5 dB ratios within each Ru element. This allowed continuous −1.5 dB volume control consisting of a string of R-2R sections. The size of the resistors need to be optimized for small area (high resistivity poly is typically 400 ohms/square) versus matching error.

In a preferred embodiment, taps 35 are provided to three points within each unit resistor Ru 34. It should be understood that other numbers of taps than three are possible as well. Taps 36 directly connected on the R/2R ladder correspond to approximately 6 dB changes in volume. The taps 35 to three points within a unit resistor Ru 34 correspond to approximately 1.5 dB in the preferred embodiment shown in FIG. 3. The R/2R network results in an increasing gain error at higher volume. settings, e.g. towards −15 dB; therefore a traditional programmable gain amplifier (PGA) approach is used for the higher gain settings, i.e. above −21 dB in a preferred embodiment.

In a traditional PGA approach total resistance R between output and input is tapped at different points to obtain a specified gain using the formula GAIN=R2/R1 where R1+R2=Rtotal. In the approach of the present invention a level G1 is set by; G1=Rx/Ru and gain steps lower than G1 are generated by tapping into different points within the R-2R ladder (generating −1.5 dB steps). It should be noted that the entire section of Ru-2Ru ladder has a equivalent resistance of Ru.

In a second embodiment of the invention an alternative configuration has been used comprising a second resistive element connected between the circuit input node and an intermediate node. wherein a first resistive element 32, as shown in FIG. 3, is connected between the intermediate node and the circuit output node.

It should be noted that the Ru-2Ru ladder as shown in FIG. 3 can be used for both single ended and differential inputs.

The second resistive element comprises a number of unit resistors matched to the unit resistors Fu 34 of the first resistive element. The unit resistors of the second resistive element are arranged in parallel and series combinations. Furthermore the second resistive element comprises a number of switches from a selection of nodes from the second resistive element to the amplifier inverting input terminal.

Figure 5:
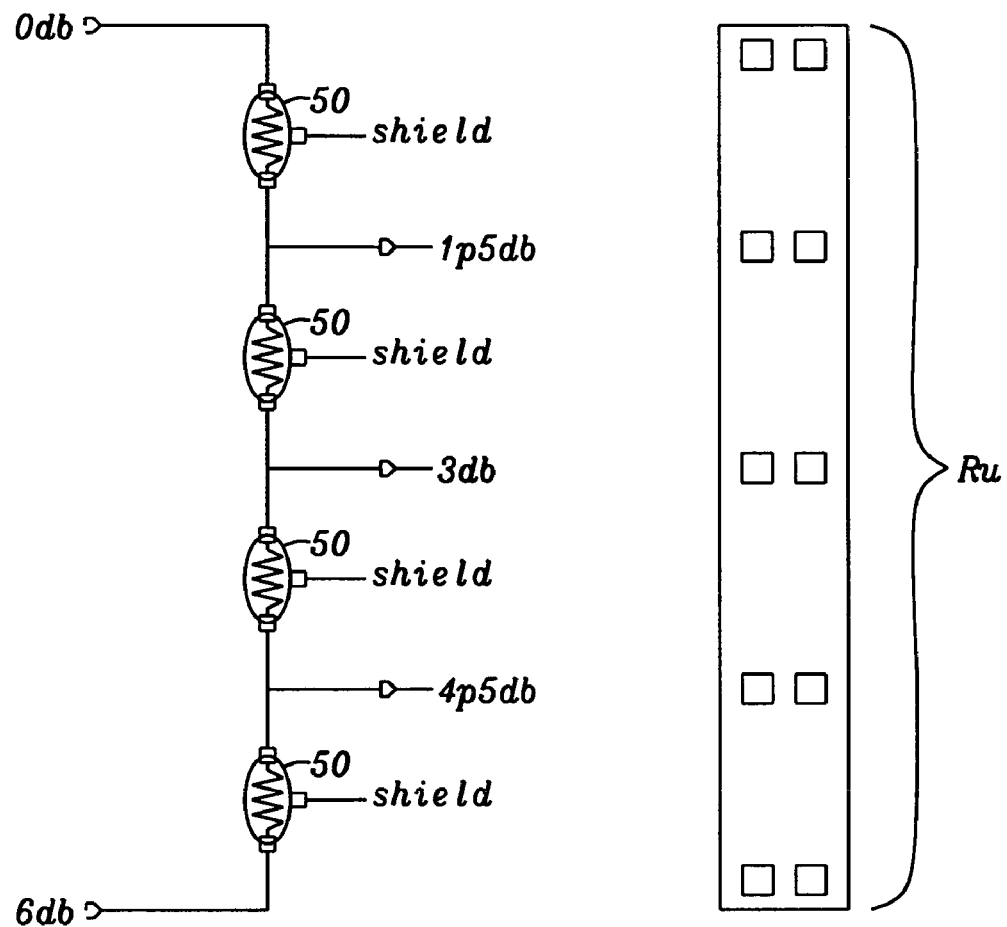
FIG. 5 shows a number of unit resistors 50 of the second resistive element arranged in series combinations.

FIG. 5 shows a number of unit resistors 50 of the second resistive element arranged in a series combinations. Taps are provided for 0 db, 1.5 db, 3 db, 4.5 db and 6 db.

In a third embodiment of the invention the circuit has a differential input and a single ended output, while in a fourth embodiment the circuit is fully differential, wherein in the third and in the fourth embodiment at least one resistive element is between an input node and an output node as outlined above.

In case of a differential input circuit the same resistive element, comprising a R/2R ladder, is deployed between each input node and an output node.

FIG. 4 illustrates a flowchart of a method to achieve a circuit for an IC audio volume control requiring minimum silicon area and having an accurate volume control gain setting. A first step 40 describes the provision of an operational amplifier, a resistive element, and a number of switches. A next step 41 illustrates arranging the resistive element as a R/2R ladder between an output node of the amplifier and an input node of the circuit. Step 42 describes connecting a first number of said switches between nodes of said R/2R ladder and an inverting input of the operational amplifier. Step 43 teaches connecting a second number of said switches between nodes within resistor units in the resistive element and the inverting input of the amplifier. Step 44 illustrates closing only one of said switches of said first and second number of switches to set a volume control gain.

While the invention has been particularly shown and described with reference to the preferred embodiments thereof, it will be understood by those skilled in the art that various changes in form and details may be made without departing from the spirit and scope of the invention.

What is claimed is:

1. A method to achieve a circuit for an IC audio volume control requiring minimum silicon area and having an accurate volume control gain setting, comprising the following steps:
   (1) providing an operational amplifier, a resistive element, and a number of switches;
   (2) arranging the resistive element as a R/2R ladder between an output node of the amplifier and an input node of the circuit;
   (3) connecting a first number of said switches between nodes of said R/2R ladder and an inverting input of the operational amplifier;
   (4) connecting a second number of said switches between nodes within resistor units in the resistive element and the inverting input of the amplifier; and
   (5) closing only one of said switches of said first and second number of switches to set a volume control gain.

2. The method of claim 1 wherein said operational amplifier is having two inputs and an output, wherein a first input is connected via a switch to said resistive element and a second input is a reference voltage and the output is an output of the circuit.

3. The method of claim 1 wherein said circuit is a differential circuit having a single output wherein a first input of the amplifier is connected via a switch to a first resistive element and a second input of the amplifier is connected via a switch to a second resistive element and the output is an output of the circuit.

4. The method of claim 1 wherein said circuit is a differential circuit having a differential output wherein a first input of the amplifier is connected via a switch to a first resistive element, which is connected to a first output of the amplifier and a second input of the amplifier is connected via a switch to a second resistive element, which is connected to a second output of the amplifier and the differential output of the amplifier is the output of the circuit.

5. The method of claim 1 wherein said circuit comprises two resistive elements, wherein a second resistive element is connected between the input node of the circuit and an intermediate node and the first resistive element is corresponds to the resistive element of claim 1 and is connected between the intermediate node and the circuit output node, wherein the second resistive element comprises a number of unit resistors matched to the resistors of the first resistive element and wherein the resistors of the second resistive element are arranged in parallel and series combinations and a number of switches are connected between a selection of nodes of the second resistive element and the amplifier inverting input terminal.

6. The method of claim 1 wherein all resistors of said resistive element are unit resistors having a same resistance, wherein said unit resistors are arranged in parallel or series combinations to achieve a resistance desired.

7. The method of claim 1 wherein said nodes within resistor units are three taps per resistor unit.

8. A circuit for an IC audio volume control requiring minimum silicon area and having an accurate volume control gain setting, comprising:
   an operational amplifier having two inputs and an output wherein a first input is connected to a reference voltage and a second inverting input is connected via one switch of a number of switches to a resistive element;
   said resistive element being connected between an input node of the circuit and an output node of the circuit, wherein the resistive element comprises a number of matched resistor units connected in a R/2R ladder arrangement;
   said number of switches being deployed between R/2R ladder nodes and the amplifier inverting input; and
   a number of switches deployed between nodes within resistor units in the resistive element and the inverting input of the amplifier.

9. The circuit of claim 8, wherein said circuit is a differential circuit having a single output wherein a first input of the amplifier is connected via a switch to a first resistive element and a second input of the amplifier is connected via a switch to a second resistive element and the output is an output of the circuit.

10. The circuit of claim 8, wherein said circuit is a differential circuit having a differential output wherein a first input of the amplifier is connected via a switch to a first resistive element, which is connected to a first output of the amplifier and a second input of the amplifier is connected via a switch to a second resistive element, which is connected to a second output of the amplifier and the differential output of the amplifier is the output of the circuit.

11. The circuit of claim 8, wherein said circuit comprises two resistive elements, wherein a second resistive element is connected between the input node of the circuit and an intermediate node and the first resistive element is corresponds to the resistive element of claim 1 and is connected between the intermediate node and the circuit output node, wherein the second resistive element comprises a number of unit resistors matched to the resistors of the first resistive element and wherein the resistors of the second resistive element are arranged in parallel and series combinations and a number of switches are connected between a selection of nodes of the second resistive element and the amplifier inverting input terminal.

12. The circuit of claim 8, wherein all resistors of said resistive element are unit resistors having a same resistance, wherein said unit resistors are arranged in parallel or series combinations to achieve a resistance desired.

13. The circuit of claim 8, wherein said nodes within resistor units are any number of taps per resistor unit.

14. The circuit of claim 13, wherein said number of taps is three taps per resistor unit.

15. The circuit of claim 8, wherein said operational amplifier is a programmable gain amplifier.

16. The circuit of claim 15, wherein the gain of the programmable gain amplifier is modified in case of gain settings above around −20 dB.

17. The circuit of claim 8, wherein all components of the circuit are integrated in one integrated circuit.

* * * * *